United States Patent
Jung et al.

(10) Patent No.: US 11,778,888 B2
(45) Date of Patent: Oct. 3, 2023

(54) ELECTROLUMINESCENT DISPLAY APPARATUS

(71) Applicant: LG Display Co., Ltd., Seoul (KR)

(72) Inventors: BoYoung Jung, Paju-si (KR); Youngsun Jang, Paju-si (KR); HongGyu Han, Paju-si (KR); Taewon Lee, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 200 days.

(21) Appl. No.: 17/121,076

(22) Filed: Dec. 14, 2020

(65) Prior Publication Data

US 2021/0202612 A1 Jul. 1, 2021

(30) Foreign Application Priority Data

Dec. 31, 2019 (KR) .................. 10-2019-0179696

(51) Int. Cl.
*G09G 3/3266* (2016.01)
*H10K 59/88* (2023.01)
*G09G 3/3275* (2016.01)
*G09G 3/3225* (2016.01)
*H10K 59/131* (2023.01)
*H10K 59/121* (2023.01)
*H01L 27/12* (2006.01)

(52) U.S. Cl.
CPC .......... *H10K 59/88* (2023.02); *G09G 3/3225* (2013.01); *G09G 3/3266* (2013.01); *G09G 3/3275* (2013.01); *H10K 59/1213* (2023.02); *H10K 59/131* (2023.02); *H01L 27/1214* (2013.01)

(58) Field of Classification Search
None
See application file for complete search history.

(56) References Cited

U.S. PATENT DOCUMENTS

| 2014/0132584 A1* | 5/2014 | Kim | ............ H10K 59/131 345/82 |
| 2015/0199932 A1* | 7/2015 | Ohara | ............ G09G 5/18 345/212 |
| 2017/0033173 A1* | 2/2017 | Kim | ............ G09G 3/3233 |
| 2020/0066212 A1* | 2/2020 | Kim | ............ G09G 3/3266 |

* cited by examiner

*Primary Examiner* — Michael A Faragalla
(74) *Attorney, Agent, or Firm* — Fenwick & West LLP

(57) ABSTRACT

Disclosed is an electroluminescent display device comprising an active area for displaying an image, a dummy area provided in the periphery of the active area, wherein an image is not displayed in the dummy area, a scan line, an initializing line and an emission line arranged along a first direction in the dummy area, a high power source line and a data line arranged along a second direction, which intersects with the first direction, in the dummy area, and a plurality of thin film transistors disposed in the dummy area, wherein the plurality of thin film transistors include a driving thin film transistor, a switching thin film transistor provided to connect the driving thin film transistor and the data line with each other, and an operation control thin film transistor provided to connect the driving thin film transistor and the high power source line with each other, wherein the switching thin film transistor and the operation control thin film transistor are disconnected from each other.

23 Claims, 8 Drawing Sheets

ELECTROLUMINESCENT DISPLAY APPARATUS

CROSS-REFERENCE TO RELATED APPLICATIONS

This application claims the benefit of the Korean Patent Application No. 10-2019-0179696 filed on Dec. 31, 2019, which are hereby incorporated by reference as if fully set forth herein.

BACKGROUND

Field of the Invention

The present disclosure relates to an electroluminescent display device, and more particularly, to an electroluminescent display device including a dummy area.

Description of the Related Art

An electroluminescent display device is provided in such a manner that an emission layer is formed between an anode electrode and a cathode electrode. As the emission layer emits light by an electric field generated between the aforementioned two electrodes, an image is displayed on the electroluminescent display device.

The electroluminescent display device may comprise an active area for displaying an image, and a dummy area on which an image is not displayed.

In the active area, a plurality of signal lines such as gate and data lines, and a plurality of thin film transistors are patterned therein. Additionally, in the dummy area, the signal lines and thin film transistors, which are similar to those of the active area, are patterned therein.

However, since an image is not displayed on the dummy area, a dummy pixel located in the dummy area is configured not to emit light. In the related art electroluminescent display device, an abnormal signal may be applied to the signal line in the dummy area, whereby the abnormal signal may be transmitted to the active area. In this case, it may have a problem of a linear mura in the active area.

SUMMARY

The present disclosure has been made in view of the above problems, and it is an object of the present disclosure to provide an electroluminescent display device which is capable of preventing a mura occurrence.

In accordance with an aspect of the present disclosure, the above and other objects can be accomplished by the provision of an electroluminescent display device comprising an active area for displaying an image, a dummy area provided in the periphery of the active area, wherein an image is not displayed in the dummy area, a scan line, an initializing line and an emission line arranged along a first direction in the dummy area, a high power source line and a data line arranged along a second direction, which intersects with the first direction, in the dummy area, and a plurality of thin film transistors disposed in the dummy area, wherein the plurality of thin film transistors include a driving thin film transistor, a switching thin film transistor provided to connect the driving thin film transistor and the data line with each other, and an operation control thin film transistor provided to connect the driving thin film transistor and the high power source line with each other, wherein the switching thin film transistor and the operation control thin film transistor are disconnected from each other.

In accordance with another aspect of the present disclosure, there is provided an electroluminescent display device comprising an active area for displaying an image, a dummy area provided in the periphery of the active area, wherein an image is not displayed in the dummy area, an active layer configured to form channel, source and drain areas of a plurality of thin film transistors provided in the active area, and a dummy active layer provided in the dummy area and configured to form channel, source and drain areas of a plurality of dummy thin film transistors, wherein a pattern of the active layer is different from a pattern of the dummy active layer.

BRIEF DESCRIPTION OF THE DRAWINGS

The above and other objects, features and other advantages of the present disclosure will be more clearly understood from the following detailed description taken in conjunction with the accompanying drawings. In the drawings.

DETAILED DESCRIPTION DISCLOSURE

Figure 1:
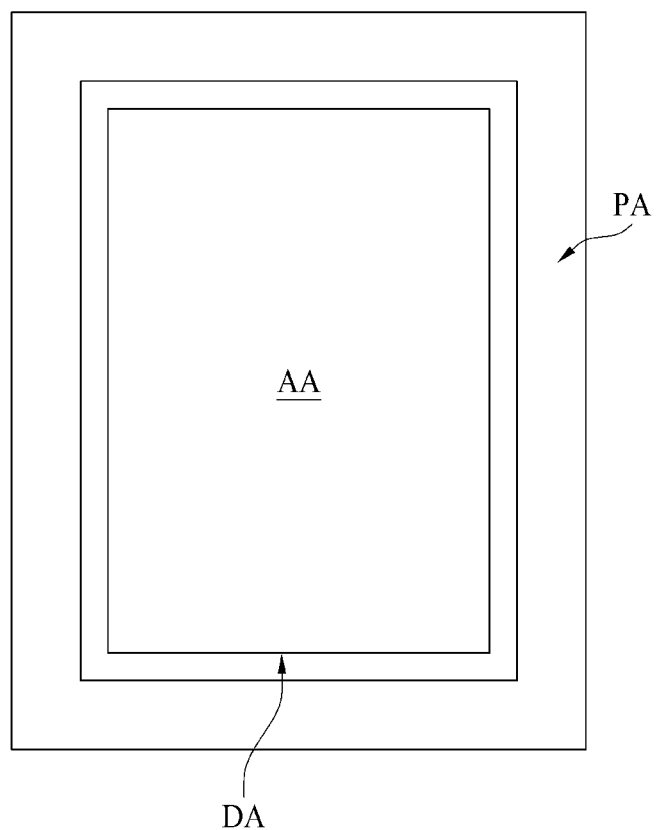
FIG. 1 is a rough plane view illustrating an electroluminescent display device according to one embodiment of the present disclosure.

Reference will now be made in detail to the various embodiments of the present disclosure, examples of which are illustrated in the accompanying drawings. Wherever possible, the same reference numbers will be used throughout the drawings to refer to the same or like parts.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing embodiments of the present disclosure are merely an example, and thus, the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted.

In construing an element, the element is construed as including an error range although there is no explicit description.

In describing a position relationship, for example, when a position relation between two parts is described as 'on~', 'over~', 'under~' and 'next~', one or more other parts may be disposed between the two parts unless 'just' or 'direct' is used.

In describing a time relationship, for example, when the temporal order is described as 'after~', 'subsequent~', 'next~', and 'before~' a case which is not continuous may be included unless 'just' or 'direct' is used.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

Hereinafter, an electroluminescent display device according to the embodiment of the present disclosure will be described in detail with reference to the accompanying drawings.

FIG. 1 is a rough plane view illustrating an electroluminescent display device according to one embodiment of the present disclosure.

As shown in FIG. 1, the electroluminescent display device according to one embodiment of the present disclosure may include an active area AA, a dummy area DA and a pad area PA.

The active area AA serves as a display area for displaying an image. A plurality of sub pixels is provided in the active area AA. In each of the plurality of sub pixels, there is an emission area. In the plurality of sub pixels provided in the active area AA, signal lines such as a scan line, a data line, an emission line, a power source line and a reference line are provided therein, and a plurality of thin film transistors for switching a transmission of a signal applied through the signal line are provided therein. Also, in the plurality of sub pixels provided in the active area AA, an organic light emitting device including an anode, a cathode and an emission layer may be provided therein, wherein the organic light emitting device is driven by the plurality of thin film transistors, and then makes a light emission.

The dummy area DA is provided to surround the active area AA. The dummy area DA is provided at left, right, lower and upper peripheral sides of the active area AA. A plurality of dummy pixels is provided in the dummy area DA. As the dummy area DA is not the display area for displaying an image, the dummy pixels provided in the dummy area DA are configured not to emit light, whereby a structure of a dummy pixel provided in the dummy area DA is different from a structure of the sub pixel provided in the active area AA. For example, an organic light emitting device is not provided in the dummy pixels of the dummy area DA. Additionally, at least one among the signal lines and the thin film transistors may be incompletely provided in the dummy pixel of the dummy area DA.

The dummy area DA reduces a likelihood of a manufacturing error between a central portion of the active area AA and an edge portion of the active area AA. This will be described in detail as follows. A plurality of deposition processes and mask processes are carried out in order to form the plurality of sub pixels in the active area AA. The deposition process may be carried out so as to form a predetermined insulating layer, a metal layer or an organic layer through the use of physical deposition process, chemical deposition process, coating process or inkjet process. The mask process may be carried out so as to form a predetermined pattern having a predetermined shape in the insulating layer, metal layer or organic layer formed by the deposition process through the use of photolithography process generally known to those in the art. When the plurality of deposition processes and mask processes are carried out in the active area AA, there is a possibility of manufacturing error between the central portion of the active area AA and the edge portion of the active area AA. According as the dummy area DA is provided in the periphery of the active area AA, even in case of the manufacturing error, the manufacturing error may be generated in the dummy area DA instead of the inside of the active area AA.

The pad area PA is provided in the periphery of the dummy area DA. A circuit driver such as a gate driver or a data driver may be prepared in the pad area PA. The circuit driver may be provided in the periphery of at least one among left, right, lower and upper sides of the dummy area DA. The circuit driver prepared in the pad area PA may be connected with a circuit device inside the active area AA via the dummy area DA.

Figure 2:
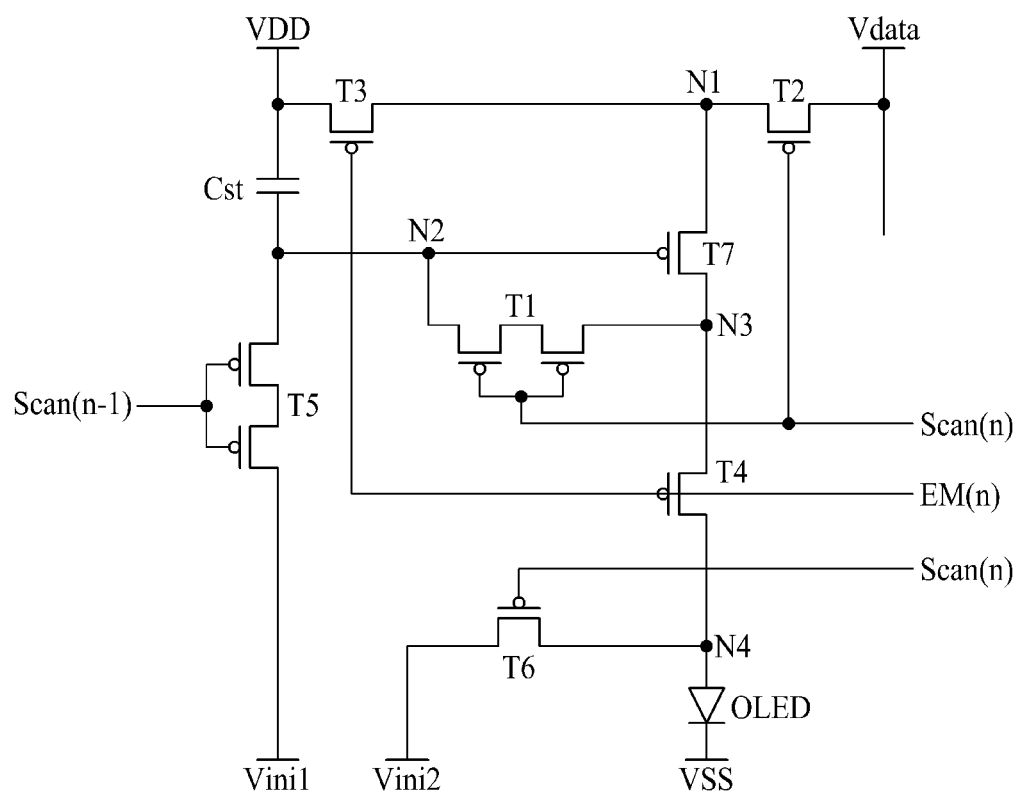
FIG. 2 is a unit circuit diagram illustrating an active area of the electroluminescent display device according to one embodiment of the present disclosure.

FIG. 2 is a unit circuit diagram illustrating the active area of the electroluminescent display device according to one embodiment of the present disclosure.

As shown in FIG. 2, the electroluminescent display device according to one embodiment of the present disclosure includes a plurality of signal lines, a plurality of thin film transistors T1 through T7, a storage capacitor Cst and an organic light emitting device OLED.

The plurality of signal lines may include a scan line Scan(n), a previous scan line Scan(n−1), an emission line EM(n), first and second initializing lines Vini1, Vini2, a high power source line VDD, a low power source line VSS and a data line Vdata.

The scan line Scan(n) supplies a scan signal to the second thin film transistor T2, the first thin film transistor T1 and the sixth thin film transistor T6.

The previous scan line Scan(n−1) supplies a previous scan signal to the fifth thin film transistor T5.

The emission line EM(n) supplies an emission control signal to the third thin film transistor T3 and the fourth thin film transistor T4.

The first and second initializing lines Vini1, Vini2 supply an initializing voltage for initializing the seventh thin film transistor T7.

The high power source line VDD supplies a driving voltage to the seventh thin film transistor T7.

The low power source line VSS supplies a low voltage to a cathode electrode of the organic light emitting device OLED.

The data line Vdata supplies a data voltage to the second thin film transistor T2.

The plurality of thin film transistors T1 through T7 may include the first thin film transistor T1, the second thin film transistor T2, the third thin film transistor T3, the fourth thin film transistor T4, the fifth thin film transistor T5, the sixth thin film transistor T6 and the seventh thin film transistor T7.

The first thin film transistor T1 corresponds to a compensation thin film transistor. In the drawings, the first thin film transistor T1 is formed in a structure having two transistors connected in series, but it is not limited to this structure. For example, instead, the first thin film transistor T1 may be formed of one transistor. A gate electrode of the first thin film transistor T1 is connected with the scan line Scan(n). A source electrode of the first thin film transistor T1 is connected with a drain electrode of the seventh thin film transistor T7 via a third node N3. A drain electrode of the first thin film transistor T1 is connected with a drain electrode of the fifth thin film transistor T5, a first capacitor electrode of the storage capacitor Cst, and a gate electrode of the seventh thin film transistor T7 via a second node N2. When the first thin film transistor T1 is turned-on by the scan signal transmitted via the scan line Scan(n), the first thin film transistor T1 electrically connects the gate and drain electrodes of the seventh thin film transistor T7 with each other. As such, the first transistor T1 enables a diode connection of the seventh thin film transistor T7.

The second thin film transistor T2 corresponds to a switching thin film transistor. A gate electrode of the second thin film transistor T2 is connected with the scan line Scan(n). A source electrode of the second thin film transistor T2 is connected with the data line Vdata. A drain electrode of the second thin film transistor T2 is connected with a drain electrode of the third thin film transistor T3 and a source electrode of the seventh thin film transistor T7 via a first node N1. When the second thin film transistor T2 is turned-on by the scan signal transmitted via the scan line Scan(n), the second thin film transistor T2 performs a switching operation for transmitting a data signal being transmitted via the data line Vdata, to the source electrode of the seven thin film transistor T7 serving as a driving thin film transistor.

The third thin film transistor T3 corresponds to an operation control thin film transistor. A gate electrode of the third thin film transistor T3 is connected with the emission line EM(n). A source electrode of the third thin film transistor T3 is connected with the high power source line VDD. A drain electrode of the third thin film transistor T3 is connected with the drain electrode of the second thin film transistor T2 and the source electrode of the seventh thin film transistor T7 via the first node N1.

The fourth thin film transistor T4 corresponds to an emission control thin film transistor. A gate electrode of the fourth thin film transistor T4 is connected with the emission line EM(n). A source electrode of the fourth thin film transistor T4 is connected with the source electrode of the first thin film transistor T1 and the drain electrode of the seventh thin film transistor T7 via a third node N3. A drain electrode of the fourth thin film transistor T4 is electrically connected with the anode electrode of the organic light emitting device OLED and a source electrode of the sixth thin film transistor T6 via a fourth node N4. When the third thin film transistor T3 and the fourth thin film transistor T4 are turned-on at the same time by the emission control signal transmitted via the emission line EM(n), the driving voltage is transmitted to the organic light emitting device OLED. As such, the third thin film transistor T3 and the fourth thin film transistor T4 make a light-emission current flow in the organic light emitting device OLED.

The fifth thin film transistor T5 corresponds to an initializing thin film transistor. In the drawings, the fifth thin film transistor T5 is formed in a structure having two transistors connected in series, but it is not limited to this structure. For example, instead, the fifth thin film transistor T5 may be formed of one transistor. A gate electrode of the fifth thin film transistor T5 is connected with the previous scan line Scan(n−1). A source electrode of the fifth thin film transistor T5 is connected with the first initializing line Vini1. A drain electrode of the fifth thin film transistor T5 is connected with a first capacitor electrode of the storage capacitor Cst, the gate electrode of the seventh thin film transistor T7, and the drain electrode of the first thin film transistor T1 via a second node N2. When the fifth thin film transistor T5 is turned-on by a previous scan signal transmitted via the previous scan line Scan(n−1), the fifth thin film transistor T5 transmits an initializing voltage to the gate electrode of the seventh thin film transistor T7. As such, the fifth thin film transistor T5 performs an initializing operation for initializing a voltage at the gate electrode of the seventh thin film transistor T7.

The sixth thin film transistor T6 corresponds to a bypass thin film transistor. A gate electrode of the sixth thin film transistor T6 is connected with the scan line Scan(n). A source electrode of the sixth thin film transistor T6 is connected with the anode electrode of the organic light emitting device OLED and the drain electrode of the fourth thin film transistor T4 via a fourth node N4. A drain electrode of the sixth thin film transistor T6 is connected with the second initializing line Vini2. Even in case where a minimum current of the seventh thin film transistor T7 so as to display a black image flows as a driving current, if the organic light emitting device OLED emits light, a black image is not displayed appropriately. Herein, the minimum current of the seventh thin film transistor T7 indicates a current when the seventh thin film transistor T7 is tuned-off by a gate-source voltage (VGS) below a threshold voltage (Vth). Thus, if the driving current of the minimum current flows, in order to prevent the organic light emitting device OLED from emitting light, the sixth thin film transistor T6 may use some of the current flowing from the seventh thin film transistor T7 as a bypass current, and may disperse the current to another current path other than a current path toward the organic light emitting device OLED.

The seventh thin film transistor T7 corresponds to a driving thin film transistor. A gate electrode of the seventh thin film transistor T7 is connected with the first capacitor electrode of the storage capacitor Cst via the second node N2. A source electrode of the seventh thin film transistor T7 is connected with the high power source line VDD via the third thin film transistor T3. A drain electrode of the seventh thin film transistor T7 is electrically connected with the anode electrode of the organic light emitting device OLED via the fourth thin film transistor T4. The seventh thin film transistor T7 receives a data signal in accordance with a switching operation of the second thin film transistor T2, and supplies a light-emission current to the organic light emitting device OLED.

The storage capacitor Cst includes the first capacitor electrode connected with the second node N2, and a second capacitor electrode connected with the high power source line VDD.

The organic light emitting device OLED includes the anode electrode connected with the fourth node N4, the cathode electrode connected with the low power source electrode VSS, and the emission layer provided between the anode electrode and the cathode electrode.

Figure 3:
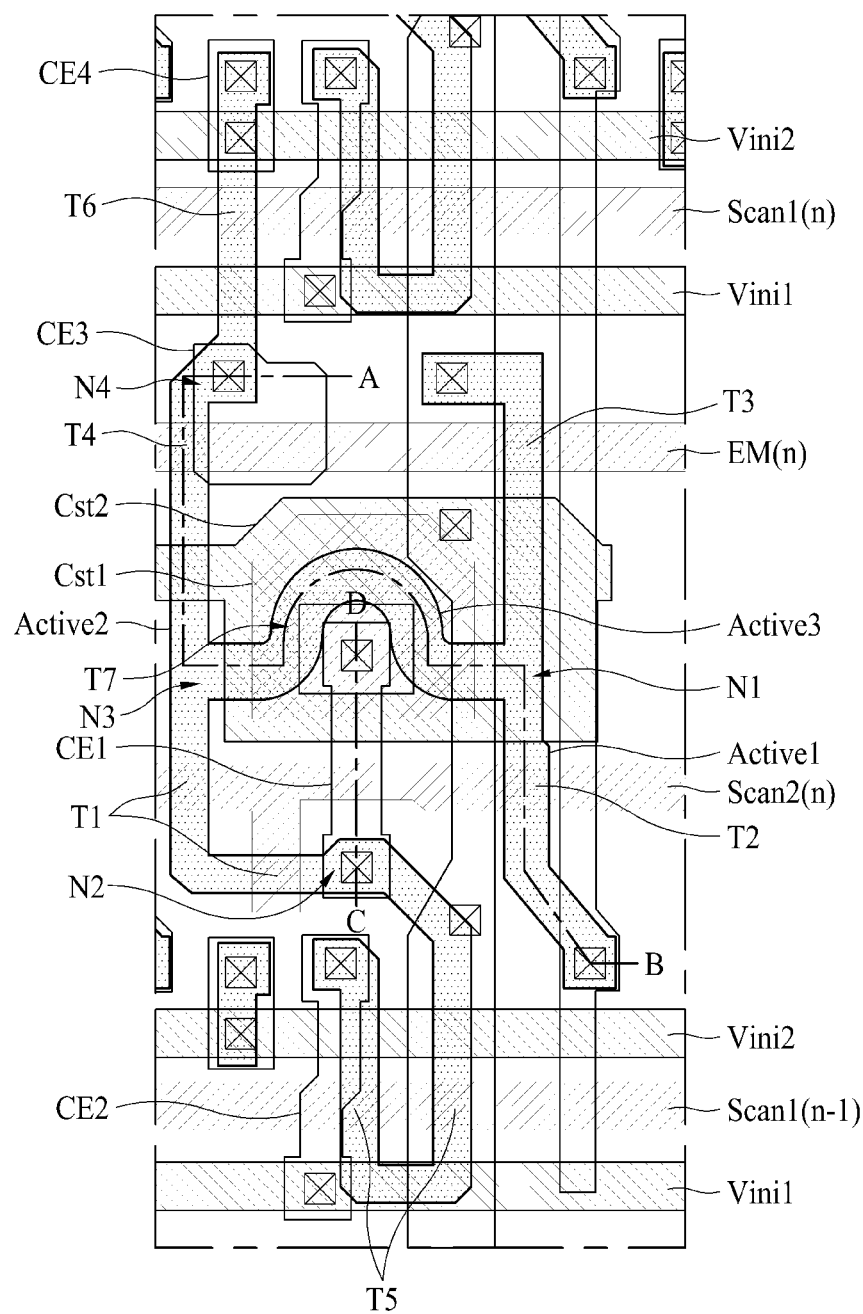
FIG. 3 is a plane view illustrating a sub pixel in the active area of the electroluminescent display device according to one embodiment of the present disclosure.

FIG. 3 is a plane view illustrating a sub pixel in the active area of the electroluminescent display device according to one embodiment of the present disclosure.

As shown in FIG. 3, along a first direction (e.g., horizontal or lengthwise direction) the first and second scan lines Scan1(n) and Scan2(n), first and second initializing lines Vini1, Vini2, and emission line (EM(n)) are arranged.

Two of the scan lines Scan1(n) and Scan2(n) are provided every sub pixel, wherein the first and second scan lines Scan1(n) and Scan2(n) are connected with each other in a non-display area corresponding to the periphery of the active area (e.g., the pad area). Thus, the same scan signal is applied to the first and second scan lines Scan1(n) and Scan2(n), at the same time. The first initializing line Vini1 is disposed between the first scan line Scan1(n) and the emission line EM(n). The emission line EM(n) is disposed between the first initializing line Vini1 and the second scan line Scan2(n). The second initializing line Vini2 may be disposed between the second scan line Scan2(n) and the first previous scan line Scan1(n−1).

Below the first previous scan line Scan1(n−1), the arrangement of the signal lines arranged in the aforementioned first direction is repeatedly provided by each sub pixel. That is, below the first previous scan line Scan1(n−1), the first initializing line Vini1, the emission line EM(n), the second previous scan line and the second initializing line Vini2 may be arranged in sequence. In this case, the first previous scan line Scan1(n−1) and the second previous scan line are connected with each other in the non-display area corresponding to the periphery of the active area (e.g., the pad area).

The first and second scan lines Scan1(n) and Scan2(n), the emission line EM(n) and the first previous scan line Scan(n−1) may be provided in the same layer, may be formed of the same material, and may be patterned by the same process. The first and second initializing lines Vini1, Vini2 may be provided in the same layer, may be formed of the same material, and may be patterned by the same process. The first and second initializing lines Vini1, Vini2 may be provided in the different layer from those of the first and second scan lines Scan1(n) and Scan2(n), the emission line EM(n) and the first previous scan line Scan1(n−1). Especially, the first and second initializing lines Vini1, Vini2 may be provided in the relatively-upper layer in comparison to the first and second scan lines Scan1(n) and Scan2(n), the emission line EM(n) and the first previous scan line Scan1(n−1).

The high power source line VDD and the data line Vdata are arranged in a direction perpendicular to the first direction (e.g., a vertical or widthwise direction). The high power source line VDD and the data line Vdata may be provided in the same layer, may be formed of the same material, and may be patterned by the same process. The high power source line VDD and the data line Vdata may be provided in the different layer from those of the first and second initializing lines Vini1, Vini2. For example, the high power source line VDD and the data line Vdata may be provided in the relatively-upper layer in comparison to the first and second initializing lines Vini1, Vini2.

Each sub pixel is provided with the first to seventh thin film transistors T1 through T7 and the storage capacitor electrodes Cst1, Cst2.

The second thin film transistor T2 corresponding to the switching thin film transistor is disposed in an overlap area where the second scan line Scan2(n) and a first active layer Active1 are overlapped with each other. The second scan line Scan2(n) becomes the gate electrode of the second thin film transistor T2.

With respect to the second scan line Scan2(n), one side of the first active layer Active1 becomes a source area of the second thin film transistor T2, wherein the source area is connected with the data line Vdata via a contact hole X, and the other side of the first active layer Active1 becomes a drain area of the second thin film transistor T2, wherein the drain area is connected with the first node N1. The area of the first active layer Active1, which is overlapped with the second scan line Scan2(n), becomes a channel area of the second thin film transistor T2. In this specification, the source area and the drain area may respectively function as the source electrode and the drain electrode.

The third thin film transistor T3 corresponding to the operation control thin film transistor is disposed in an overlap area where the emission line EM(n) and the first active layer Active1 are overlapped with each other. The emission line EM(n) becomes the gate electrode of the third thin film transistor T3.

With respect to the emission line EM(n), one side of the first active layer Active1 becomes a source area of the third thin film transistor T3, wherein the source area is connected with the high power source line VDD via a contact hole X, and the other side of the first active layer Active1 becomes a drain area of the third thin film transistor T3, wherein the drain area is connected with the first node N1. The area of the first active layer Active1, which is overlapped with the emission line EM(n), becomes a channel area of the third thin film transistor T3.

As described above, the first active layer Active1 extends in the second direction, and intersects with the second scan line Scan2(n) and the emission line EM(n). Additionally, one end of the first active layer Active1 (e.g., an upper end of the first active layer Active1) is connected with the high power source line VDD via a contact hole X, and the other end of the first active layer Active1 (e.g., a lower end of the first active layer Active1) is connected with the data line Vdata via a contact hole X. Additionally, the first active layer Active1 is connected with a third active layer Active3 at the first node N1.

The first active layer Active1 forms the channel area, source area and drain area of the second thin film transistor T2. The first active layer Active1 also forms the channel area, source area and drain area of the third thin film transistor T3.

The first active layer Active1 may be provided in the different layer from those of the first and second scan lines Scan1(n) and Scan2(n), the emission line EM(n) and the first previous scan line Scan1(n−1). For example, the first active layer Active1 may be provided in the relatively-lower layer in comparison to the first and second scan lines Scan1(n) and Scan2(n), the emission line EM(n) and the first previous scan line Scan1(n−1).

The first thin film transistor T1 corresponding to the compensation thin film transistor is prepared in an overlap area where the second scan line Scan2(n) and a second active layer Active2 are overlapped with each other. The second scan line Scan2(n) becomes the gate electrode of the first thin film transistor T1.

The second scan line Scan2(n) may include an extending portion which extends in the first direction, and a protruding portion which protrudes from the extending portion in the second direction. The second active layer Active2 may have two transistors which intersect with each of the extending and protruding portions of the second scan line Scan2(n), and are connected in series, but not limited to this structure. For example, the protruding portion may be not provided in the second scan line Scan2(n). In this case, the first thin film transistor T1 may be provided with one transistor.

With respect to the second scan line Scan2(n), one side of the second active layer Active2 becomes a source area of the first thin film transistor T1, wherein the source area is connected with a third node N3, and the other side of the second active layer Active2 becomes a drain area of the first thin film transistor T1, wherein the drain area is connected with a first connection electrode CE1 via a contact hole X at the second node N2. One end of the first connection electrode CE1 is connected with the second active layer Active2 via a contact hole X, and the other end of the first connection electrode CE1 may be electrically connected with the gate electrode of the seventh thin film transistor T7 via a contact hole X.

Thus, the drain area of the first thin film transistor T1 may be electrically connected with the gate electrode of the seventh thin film transistor T7 via the first connection electrode CE1. The first connection electrode CE1 may be provided in the same layer as those of the high power source line VDD and the data line Vdata, and may be formed of the same material as those of the high power source line VDD and the data line Vdata, and the first connection electrode CE1, the high power source line VDD and the data line Vdata may be patterned by the same process. The area of the second active layer Active2, which is overlapped with the second scan line Scan2(n), becomes a channel area of the first thin film transistor T1.

The fifth thin film transistor T5 corresponding to the initializing thin film transistor is disposed in an overlap area where the first previous scan line Scan1(n−1) and the second active layer Active2 are overlapped with each other. The first previous scan line Scan1(n−1) becomes the gate electrode of the fifth thin film transistor T5.

Accordingly, as the second active layer Active2 is bent while being twice intersected with the first previous scan line Scan1(n−1), the fifth thin film transistor T5 may be formed in a structure comprising two transistors which are connected in series, but not necessarily. Accordingly, as the second active layer Active2 is bent while being once intersected with the first previous scan line Scan1(n−1), the fifth thin film transistor T5 may be formed in a structure including one transistor.

With respect to the first previous scan line Scan1(n−1), one side of the second active layer Active2 becomes a source area of the fifth thin film transistor T5, wherein the source area is connected with the second connection electrode CE2 via a contact hole X. One end of the second connection electrode CE2 is connected with the second active layer Active2 via a contact hole X, and the other end of the second connection electrode CE2 is connected with the first initializing line Vini1 via a contact hole X. Thus, the source area of the fifth thin film transistor T5 is connected with the first initializing line Vini1 via the second connection electrode CE2. The second connection electrode CE2 may be provided in the same layer as those of the high power source line VDD and the data line Vdata, and may be formed of the same material as those of the high power source line VDD and the data line Vdata, and the second connection electrode CE2, the high power source line VDD and the data line Vdata may be patterned by the same process. With respect to the first previous scan line Scan1(n−1), the other side of the second active layer Active2 becomes a drain area of the fifth thin film transistor T5, wherein the drain area is connected with the first connection electrode CE1 via a contact hole X at the second node N2. Thus, the drain area of the fifth thin film transistor T5 is electrically connected with the gate electrode of the seventh thin film transistor T7 via the first connection electrode CE1. The area of the second active layer Active2, which is overlapped with the first previous scan line Scan1 (n−1), becomes a channel area of the fifth thin film transistor T5.

The fourth thin film transistor T4 corresponding to the emission control thin film transistor is disposed in an overlap area wherein the emission line EM(n) and the second active layer Active2 are overlapped with each other. The emission line EM(n) becomes the gate electrode of the fourth thin film transistor T4.

With respect to the emission line EM(n), one side of the second active layer Active2 becomes a source area of the fourth thin film transistor T4, wherein the source area is connected with the third node N3, and the other side of the second active layer Active2 becomes a drain area of the fourth thin film transistor T4, wherein the drain area is connected with a third connection electrode CE3 via a contact hole X at the fourth node N4. The third connection electrode CE3 connects the fourth node N4 and the anode electrode of the organic light emitting device OLED with each other. Thus, the drain area of the fourth thin film transistor T4 is electrically connected with the anode electrode of the organic light emitting device OLED via the third connection electrode CE3. The third connection electrode CE3 may be provided in the same layer as those of the high power source line VDD and the data line Vdata, and may be formed of the same material as those of the high power source line VDD and the data line Vdata, and the third connection electrode CE3, the high power source line VDD and the data line Vdata may be patterned by the same process. The area of the second active layer Active2, which is overlapped with the emission line EM(n), becomes a channel area of the fourth thin film transistor T4.

The sixth thin film transistor T6 corresponding to the bypass thin film transistor is disposed in an overlap area between the first scan line Scan1(n) and the second active layer Active2. The first scan line Scan1(n) becomes the gate electrode of the sixth thin film transistor T6.

With respect to the first scan line Scan1(n), one side of the second active layer Active2 becomes a source area of the sixth thin film transistor T6, and the source area is connected with the fourth node N4. Thus, the source area of the sixth thin film transistor T6 is electrically connected with the anode electrode of the organic light emitting device OLED via the third connection electrode CE3. With respect to the first scan line Scan1(n), the other side of the second active layer Active2 becomes a drain area of the sixth thin film transistor T6, and the drain area is connected with the fourth connection electrode CE4 via a contact hole X. One end of the fourth connection electrode CE4 is connected with the second active layer Active2 via a contact hole X, and the other end of the fourth connection electrode CE4 is connected with the second initializing line Vini2 via a contact hole X. Thus, the drain area of the sixth thin film transistor T6 is connected with the second initializing line Vini2 via the fourth connection electrode CE4. The fourth connection electrode CE4 may be provided in the same layer as those of the high power source line VDD and the data line Vdata, and may be formed of the same material as those of the high power source line VDD and the data line Vdata, and the fourth connection electrode CE4, the high power source line VDD and the data line Vdata may be patterned by the same process. The area of the second active layer Active2, which is overlapped with the first scan line Scan1(n), becomes a channel area of the sixth thin film transistor T6.

As described above, the second active layer Active2 extends in the second direction, and intersects with the first scan line Scan1(n), the second scan line Scan2(n), the emission line EM(n) and the first previous scan line Scan1(n−1). Additionally, one end of the second active layer Active2 (e.g., an upper end of the second active layer Active2) is connected with the second initializing line Vini2 via the fourth connection electrode CE4 through a contact hole X, and the other end of the second active layer Active2 (e.g., a lower end of the second active layer Active2) is connected with the first initializing line Vini1 via the second connection electrode CE2 through a contact hole X. Additionally, the second active layer Active2 is connected with the anode electrode of the organic light emitting device OLED via the third connection electrode CE3 through a contact hole X at the fourth node N4, and is connected with the gate electrode of the seventh thin film transistor T7 via the first connection electrode CE1 through a contact hole X at the second node N2, and is also connected with the third active layer Active3 at the third node N3.

The second active layer Active2 forms the channel area, source area and drain area of the first thin film transistor T1; the channel area, source area and drain area of the fourth thin film transistor T4; the channel area, source area and drain area of the fifth thin film transistor T5; and the channel area, source area and drain area of the sixth thin film transistor T6.

In the same manner as the first active layer Active1, the second active layer Active2 may be provided in the different layer from those of the first and second scan lines Scan1(n) and Scan2(n), the emission line EM(n) and the first previous scan line Scan1(n−1). For example, the second active layer Active2 may be provided in the relatively-lower layer in comparison to the first and second scan lines Scan1(n) and Scan2(n), the emission line EM(n) and the first previous scan line Scan1(n−1). The second active layer Active2 may extend to be parallel to the first active layer Active1.

The seventh thin film transistor T7 corresponding to the driving thin film transistor is disposed in an overlap area between the first capacitor electrode Cst1 and the third active layer Active3. The first capacitor electrode Cst1 becomes the gate electrode of the seventh thin film transistor T7. The first capacitor electrode Cst1 is connected with the first connection electrode CE1 via a contact hole X.

With respect to the first capacitor electrode Cst1, one side of the third active layer Active3 becomes a drain area of the seventh thin film transistor T7, and the drain area is connected with the third node N3. With respect to the first capacitor electrode Cst1, the other side of the third active layer Active3 becomes a source area of the seventh thin film transistor T7, and the source area is connected with the first node N1. Thus, the source area of the seventh thin film transistor T7 is connected with the high power source line VDD via the first node N1 and the third thin film transistor T3, and the drain area of the seventh thin film transistor T7 is electrically connected with the anode electrode of the organic light emitting device OLED via the third node N3, the fourth thin film transistor T4, the fourth node N4 and the third connection electrode CE3. This case shows that the seventh thin film transistor T7 is formed of a P-type transistor. If the seventh thin film transistor T7 is formed of an N-type transistor, the source area is electrically connected with the anode electrode of the organic light emitting device OLED, and the drain area is connected with the high power source line VDD. The area of the third active layer Active3, which is overlapped with the first capacitor electrode Cst1, becomes a channel area of the seventh thin film transistor T7.

The third active layer Active3 forms the channel area, source area and drain area of the seventh thin film transistor T7.

In the same manner as the first active layer Active1, the third active layer Active3 may be provided in the different layer from those of the first and second scan lines Scan1(n) and Scan2(n), the emission line EM(n) and the first previous scan line Scan1(n−1). For example, the third active layer Active3 may be provided in the relatively-lower layer in comparison to the first and second scan lines Scan1(n) and Scan2(n), the emission line EM(n) and the first previous scan line Scan1(n−1). One end of the third active layer Active3 is connected with the second active layer Active2 at the third node N3, and the other end of the third active layer Active3 is connected with the first active layer Active1 at the first node N1.

The third active layer Active3 may be provided in the same layer as those of the first active layer Active1 and the second active layer Active2, and may be formed of the same material as those of the first active layer Active1 and the second active layer Active2, and the first, second and third active layers Active1, Active2, Active3 may be patterned by the same process. Accordingly, the first active layer Active1, the second active layer Active2 and the third active layer Active3 may be formed as one body.

The storage capacitor electrodes Cst1, Cst2 includes the first and second capacitor electrodes Cst1, Cst2 which are overlapped with each other.

The first capacitor electrode Cst1 may function as the gate electrode of the seventh thin film transistor T7, and the first capacitor electrode Cst1 may be connected with the first connection electrode CE1 via a contact hole X. The first capacitor electrode Cst1 may be formed in the same layer as those of the first and second scan lines Scan1(n) and Scan2(n), the emission line EM(n) and the first previous scan line Scan1(n−1), and may be formed of the same material as those of the first and second scan lines Scan1(n) and Scan2(n), the emission line EM(n) and the first previous scan line Scan1(n−1), and the first capacitor electrode Cst1, the first and second scan lines Scan1(n) and Scan2(n), the emission line EM(n) and the first previous scan line Scan1(n−1) may be patterned by the same process.

The second capacitor electrode Cst2 is connected with the high power source line VDD via a contact hole X. The second capacitor electrode Cst2 may be provided in the different layer from that of the first capacitor electrode Cst1. For example, the second capacitor electrode Cst2 may be provided in the relatively-upper layer in comparison to the first capacitor electrode Cst1. In particular, the second capacitor electrode Cst2 may be provided in the same layer as those of the first and second initializing lines Vini1, Vini2, and may be formed of the same material as those of the first and second initializing lines Vini1, Vini2, and the second capacitor electrode Cst2 and the first and second initializing lines Vini1, Vini2 may be patterned by the same process. Thus, the second capacitor electrode Cst2 may be provided in a layer between the first capacitor electrode Cst1 and the first connection electrode CE1. In order to reduce the likelihood of a short, the second capacitor electrode Cst2 may be provided with an opening area in an area for a contact hole X configured to connect the first capacitor electrode Cst1 and the first connection electrode CE1 with each other.

Figure 4:
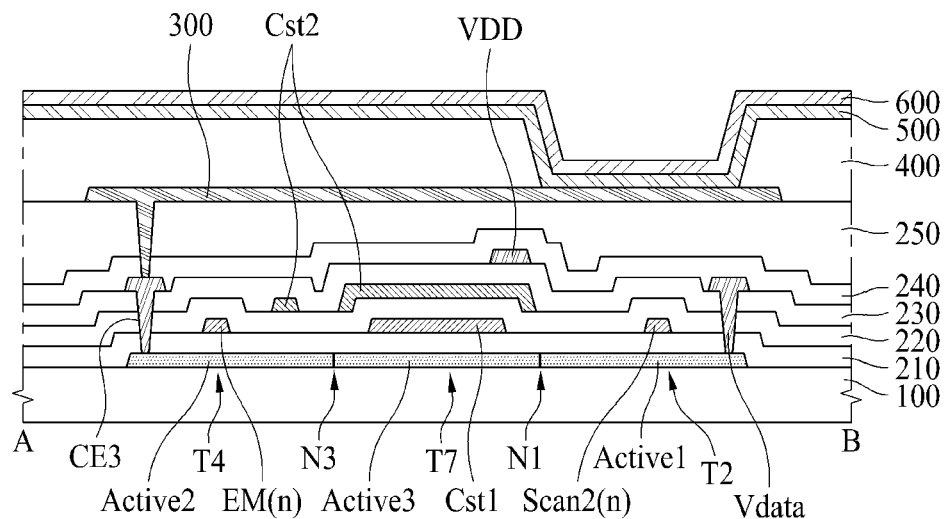
FIG. 4 is a cross sectional view along A-B line of FIG. 3.

FIG. 4 is a cross sectional view along A-B line of FIG. 3. That is, FIG. 4 is a cross sectional view of the fourth thin film transistor T4, the seventh thin film transistor T7 and the second thin film transistor T2 in the active area.

As shown in FIG. 4, the second active layer Active2, the third active layer Active3 and the first active layer Active1 are formed on a substrate 100. The second active layer Active2 forms the channel area, source area and drain area of the fourth thin film transistor T4; the third active layer Active3 forms the channel area, source area and drain area of the seventh thin film transistor T7; and the first active layer Active1 forms the channel area, source area and drain area of the second thin film transistor T2.

The third node N3 is provided in the boundary area between the second active layer Active2 and the third active layer Active3, and the first node N1 is provided in the boundary area between the third active layer Active3 and the first active layer Active1. The second active layer Active2, the third active layer Active3 and the first active layer Active1 are connected with one another, and are formed as one body. Although not shown, a light shielding layer for preventing a permeation of ambient light may be provided below the second active layer Active2, the third active layer Active3 and the first active layer Active1. If the light shielding layer is formed of a conductive material, a buffer layer is provided between the light shielding layer and the active layer Active2, Active3, Active1.

A gate insulating layer 210 is formed on the second active layer Active2, the third active layer Active3 and the first active layer Active1. Then, the emission line EM(n), the first capacitor electrode Cst1 and the second scan line Scan2(n) are formed on the gate insulating layer 210. The emission line EM(n) functions as the gate electrode of the fourth thin film transistor T4, the first capacitor electrode Cst1 functions as the gate electrode of the seventh thin film transistor T7, and the second scan line Scan2(n) functions as the gate electrode of the second thin film transistor T2.

A first insulating interlayer 220 is formed on the emission line EM(n), the first capacitor electrode Cst1 and the second scan line Scan2(n), and the second scan line Scan2(n), and the second capacitor electrode Cst2 is formed on the first insulating interlayer 220. The second capacitor electrode Cst2 is overlapped with the first capacitor electrode Cst1 with the first insulating interlayer 220 is interposed in-between, to thereby form the storage capacitor.

A second insulating interlayer 230 is formed on the second capacitor electrode Cst2. Then, the third connection electrode CE3, the high power source line VDD and the data line Vdata are formed on the second insulating interlayer 230. The third connection electrode CE3 is connected with the second active layer Active2 via a contact hole provided in the gate insulating layer 210, the first insulating interlayer 220 and the second insulating interlayer 230. The data line Vdata is connected with the first active layer Active1 via a contact hole provided in the gate insulating layer 210, the first insulating interlayer 220 and the second insulating interlayer 230.

A passivation layer 240 is formed on the third connection electrode CE3, the high power line VDD and the data line Vdata, and a planarization layer 250 is formed on the passivation layer 240.

An anode electrode 300 is formed on the planarization layer 250. The anode electrode 300 may be connected with the third connection electrode CE3 via a contact hole provided in the passivation layer 240 and the planarization layer 250. Although not shown, the planarization layer 250 may be formed in a dual-layered structure comprising first and second planarization layers, wherein an additional connection electrode layer is provided between the first planarization layer and the second planarization layer, and an electrical connection between the third connection electrode CE3 and the anode electrode 300 is made by the use of additional connection electrode layer.

A bank 400 is formed on each of both ends of the anode electrode 300. An opening area of the anode electrode 300, in which the bank 400 is not provided, becomes an emission area. If the electroluminescent display device according to the present disclosure is formed in a bottom emission structure, the opening area may be prepared in an area which is not overlapped with the plurality of thin film transistors T1 through T7. If the electroluminescent display device according to the present disclosure is formed in a top emission structure, the opening area may be prepared in an area which is overlapped with the plurality of thin film transistors T1 through T7.

An organic emission layer 500 is formed on the anode electrode 300, and a cathode electrode 600 is formed on the organic emission layer 500. The organic emission layer 500 is formed on the bank 400, and is provided while being connected among the plurality of sub pixels. In this case, the organic emission layer 500 may be configured to emit white colored light, and may be provided with an additional color filter of red color, green color or blue color by each sub pixel. The organic emission layer 500 configured to emit white colored light may comprise a first stack for emitting blue color, a second stack for emitting yellow green color, and a charge generation layer provided between the first stack and the second stack.

Figure 5:
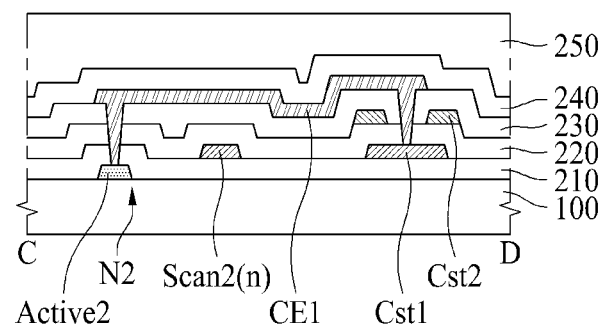
FIG. 5 is a cross sectional view along C-D line of FIG. 3.

FIG. 5 is a cross sectional view along C-D line of FIG. 3. That is, FIG. 5 corresponds to a cross sectional view of the first connection electrode CE1.

As shown in FIG. 5, the second active layer Active2 is formed on a substrate 100. The second active layer Active2 corresponds to the area for the second node N2. Although not shown, a light shielding layer for preventing a permeation of ambient light may be provided below the second active layer Active2, and a buffer layer may be provided between the light shielding layer and the active layer Active2, Active3, Active1.

A gate insulating layer 210 is formed on the second active layer Active2, and the second scan line Scan2(n) and the first capacitor electrode Cst1 are formed on the gate insulating layer 210.

A first insulating interlayer 220 is formed on the second scan line Scan2(n) and the first capacitor electrode Cst1, and the second capacitor electrode Cst2 is formed on the first insulating interlayer 220. In this case, the second capacitor electrode Cst2 is provided with an opening area, whereby the first capacitor electrode Cst1 may be exposed via the opening area.

A second insulating interlayer 230 is formed on the second capacitor electrode Cst2, and the first connection electrode CE1 is formed on the second insulating interlayer 230.

One end of the first connection electrode CE1 is connected with the second active layer Active2 via a contact hole provided in the gate insulating layer 210, the first insulating interlayer 220 and the second insulating interlayer 230. The other end of the first connection electrode CE1 is connected with the first capacitor electrode Cst1 via a contact hole provided in the first insulating interlayer 220 and the second insulating interlayer 230. In this case, the opening area provided in the second capacitor electrode Cst2 is overlapped with the contact hole while being provided with a relatively-larger size in comparison to that of the contact hole. Thus, when the first connection electrode CE1 is connected with the first capacitor electrode Cst1 via the contact hole, the first connection electrode CE1 is not in contact with the second capacitor electrode Cst2. Accordingly, it is possible to reduce the likelihood of a short between the first capacitor electrode Cst1 and the second capacitor electrode Cst2.

A passivation layer 240 is formed on the first connection electrode CE1, and a planarization layer 250 is formed on the passivation layer 240. Although not shown, in the same manner as those of above FIG. 4, an anode electrode 300, a bank 400, an organic emission layer 500 and a cathode electrode 600 may be formed on the planarization layer 250.

Figure 6:
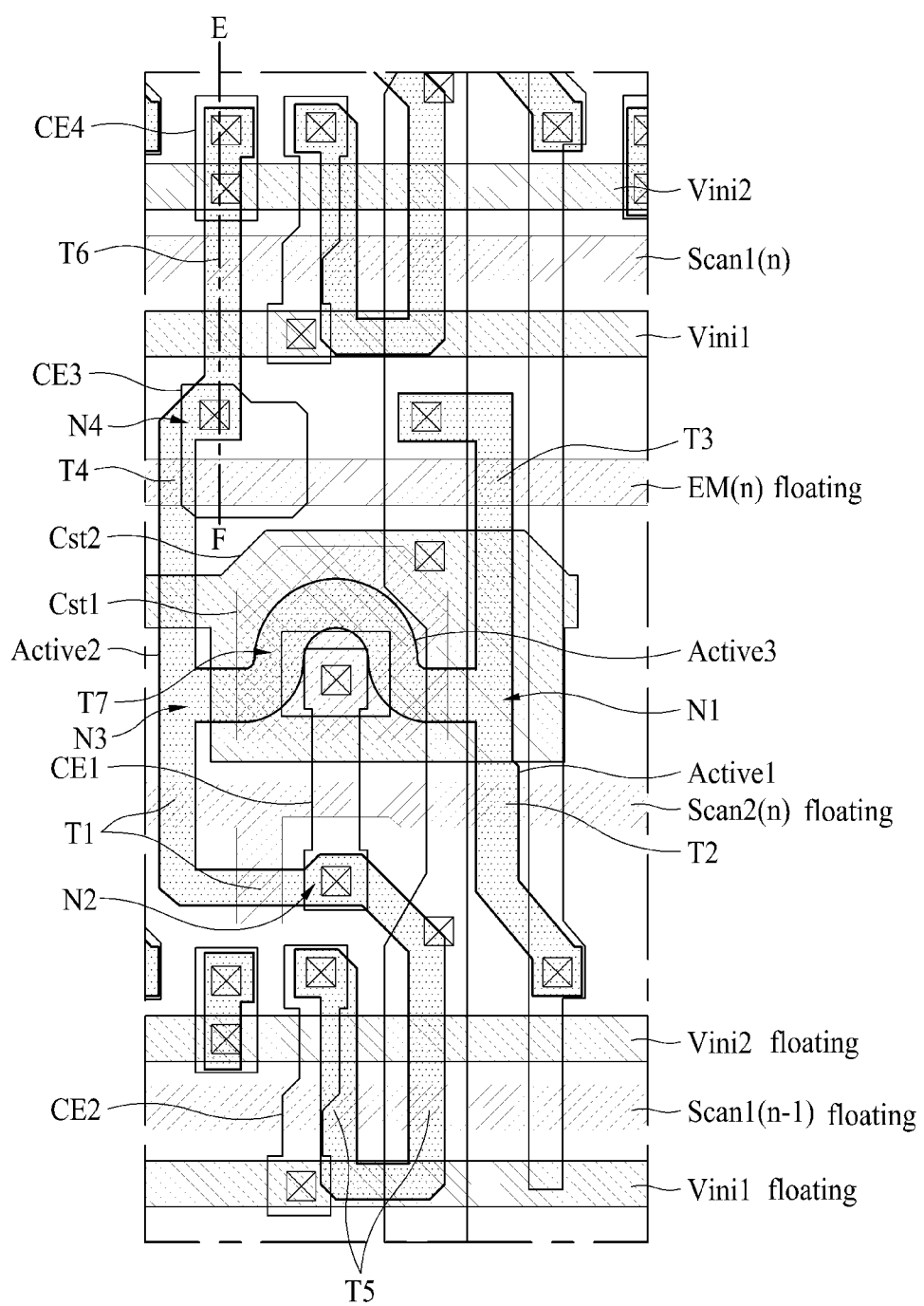
FIG. 6 is a plane view illustrating a dummy pixel in a dummy area of the electroluminescent display device according to one embodiment of the present disclosure.

FIG. 6 is a plane view illustrating the dummy pixel in the dummy area of the electroluminescent display device according to one embodiment of the present disclosure. The dummy area may be positioned below the active area. The dummy pixel of the dummy area shown in FIG. 6 may be identical in structure of circuit configuration to the sub pixel of the active area shown in FIG. 3. However, the dummy area is not an area for displaying an image, whereby the dummy pixel prepared in the dummy area is configured not to generate a light emission. Accordingly, the organic light emitting device including the anode electrode, the organic emission layer and the cathode electrode is not provided in the dummy pixel. Moreover, the signal line provided in the dummy pixel may be formed in an incomplete state. In particular, the emission line EM(n) of the dummy area is formed in a floating state, whereby it is possible to prevent the signal from being normally applied to the emission line EM(n).

In this specification, the signal line of the floating state indicates that an electrical connection between the signal line and a circuit driver is prevented and a normal signal supply from the circuit driver is impossible.

In the entire specification including claims, an addition of dummy in front of the specific component indicates that the specific component is provided in the dummy area. For example, a dummy scan line indicates the scan lines Scan1 (n) and Scan2(n) provided in the dummy area, a dummy active layer indicates the active layer Active1, Active2, Active3 provided in the dummy area, and a dummy thin film transistor indicates the thin film transistor T1 through T7 provided in the dummy area.

Also, as shown in the drawings, among the signal lines of the dummy area, the upper-positioned first scan line Scan1 (n) and initializing line Vini1, Vini2, which have an influence on the light emission of the active area, may be configured to have the normal signal application, however, the lower-positioned second scan line Scan2(n), initializing line Vini1, Vini2, and first previous scan line Scan1(n-1) which have no influence on the light emission of the active area, may be configured to have the floating state in which the signal is not normally applied.

According to one embodiment of the present disclosure, the plurality of signal lines provided in the dummy area, especially, the emission line EM(n) is configured to have the floating state, and the organic light emitting device is not provided in the dummy area, whereby the light emission is not generated in the dummy pixel.

Due to various reasons such as static electricity for a manufacturing process, if an abnormal signal is applied to the emission line EM(n) of the floating state, and the abnormal signal flows into the data line, whereby a problem related with a vertical linear mura may occur in the active area. This will be described with reference to FIG. 7.

Figure 7:
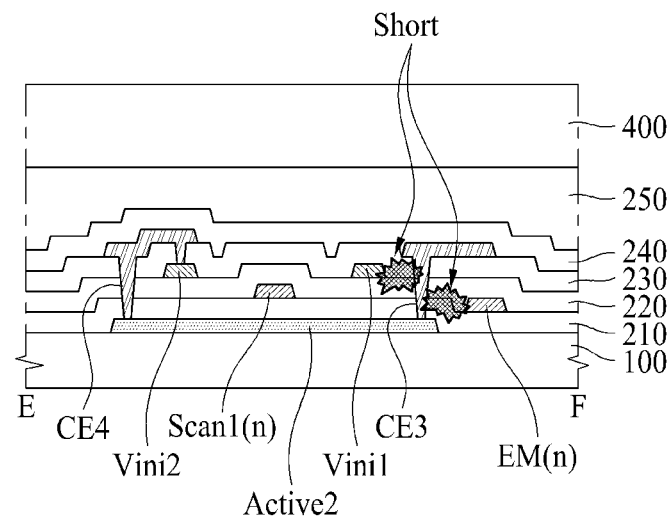
FIG. 7 is a cross sectional view along E-F line of FIG. 6.

FIG. 7 is a cross sectional line along E-F line of FIG. 6. That is, FIG. 7 corresponds to a cross section of the sixth thin film transistor T6 in the dummy area.

As shown in FIG. 7, the second active layer Active2 is formed on a substrate 100. The second active layer Active2 forms the channel area, source area and drain area of the sixth thin film transistor T6. Although not shown, a light shielding layer for preventing a permeation of ambient light may be provided below the second active layer Active2, and a buffer layer is provided between the light shielding layer and the second active layer Active2.

A gate insulating layer 210 is formed on the second active layer Active2. Then, the first scan line Scan1(n) and the emission line EM(n) are formed on the gate insulating layer 210. The first scan line Scan1(n) functions as the gate electrode of the sixth thin film transistor T6.

A first insulating interlayer 220 is formed on the first scan line Scan1(n) and the emission line EM(n), and the first and second initializing lines Vini1, Vini2 are formed on the first insulating interlayer 220.

A second insulating interlayer 230 is formed on the first and second initializing lines Vini1, Vini2, and the fourth and third connection electrodes CE4, CE3 are formed on the second insulating interlayer 230.

The fourth connection electrode CE4 is connected with one end of the second active layer Active2 via a contact hole provided in the gate insulating layer 210, the first insulating interlayer 220 and the second insulating interlayer 230. Moreover, the third connection electrode CE3 is connected with the other end of the second active layer Active2 via a contact hole provided in the gate insulating layer 210, the first insulating interlayer 220 and the second insulating interlayer 230.

A passivation layer 240 is formed on the fourth connection electrode CE4 and the third connection electrode CE3, a planarization layer 250 is formed on the passivation layer 240, and a bank 400 is formed on the planarization layer 250. That is, as the organic light emitting device is not provided in the dummy area, the bank 400 may be formed on an upper entire surface of the planarization layer 250.

In this case, the third connection electrode CE3 which extends through the contact hole is connected with the other end of the second active layer Active2, whereby the third connection electrode CE3 and the emission line EM(n) are positioned adjacent to each other while being provided with the insulating layer 210, 220 and 230 interposed in-between. Moreover, the third connection electrode CE3 and the first initializing line Vini1 are positioned adjacent to each other while being provided with the insulating layer 210, 220 and 230 interposed in-between. Due to various reasons for a manufacturing process, cracks may be generated in some portions of the insulating layer 210, 220 and 230, whereby a short may be generated between the third connection electrode CE3 and the emission line EM(n). In addition, a short may be generated between the third connection electrode CE3 and the first initializing line Vini1. As a result, a short may be generated between the emission line EM(n) and the first initializing line Vini1 through the third connection electrode CE3.

If the short is generated between the emission line EM(n) and the first initializing line Vini1, the signal of the first initializing line Vini1 is abnormally applied to the emission line EM(n), whereby the aforementioned third thin film transistor T3 is turned-on by the signal abnormally applied to the emission line EM(n). Thus, the abnormal signal flows into the data line Vdata via the second thin film transistor T2, whereby a vertical linear mura may occur in the entire active area.

According to another embodiment of the present invention, a method for preventing a mura occurrence even in case of the short between the emission line EM(n) and the first initializing line Vini1 in the dummy area is proposed as follows.

Figure 8:
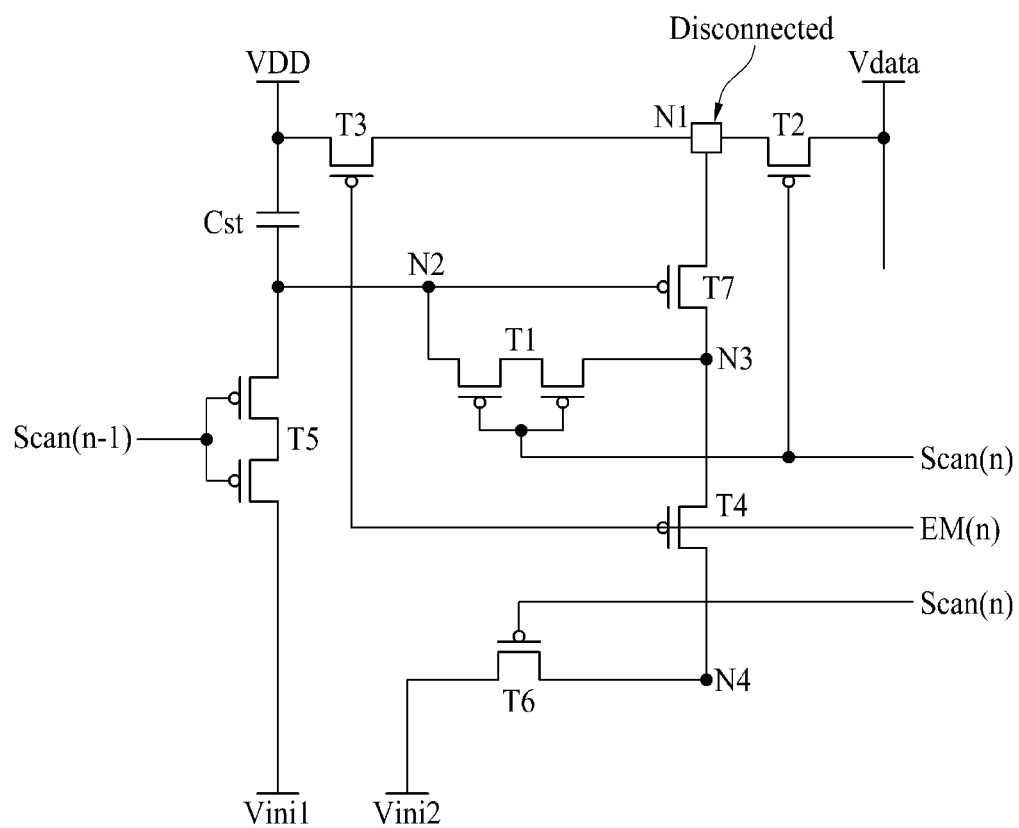
FIG. 8 is a unit circuit diagram illustrating a dummy area of an electroluminescent display device according to another embodiment of the present disclosure.

FIG. 8 is a unit circuit diagram illustrating a dummy area of an electroluminescent display device according to another embodiment of the present disclosure.

Except that an organic light emitting device OLED is not provided and a first node N1 is disconnected, the unit circuit diagram of the dummy area shown in FIG. 8 is identical to the unit circuit diagram of the active area shown in FIG. 2, whereby only different parts will be described in detail.

As shown in FIG. 8, an organic light emitting device connected with a fourth node N4 is not provided in the dummy area according to another embodiment of the present disclosure.

Also, in the dummy area according to another embodiment of the present disclosure, a first node N1 for a connection of a second thin film transistor T2, a third thin film transistor T3 and a seventh thin film transistor T7 is disconnected. Thus, even though the third thin film transistor T3 is turned-on by an abnormal signal applied to an emission line EM(n), it is possible to prevent the abnormal signal from flowing into a data line Vdata via the second thin film transistor T2, to thereby prevent an occurrence of a vertical linear mura in an active area.

In detail, according to another embodiment of the present disclosure, a connection between the second thin film transistor T2 and the third thin film transistor T3 is discontinued so that the abnormal signal does not flow via the second thin film transistor T2. Moreover, a connection between the second thin film transistor T2 and the seventh thin film transistor T7 and a connection between the third thin film transistor T3 and the seventh thin film transistor T7 may be additionally discontinued.

Figure 9:
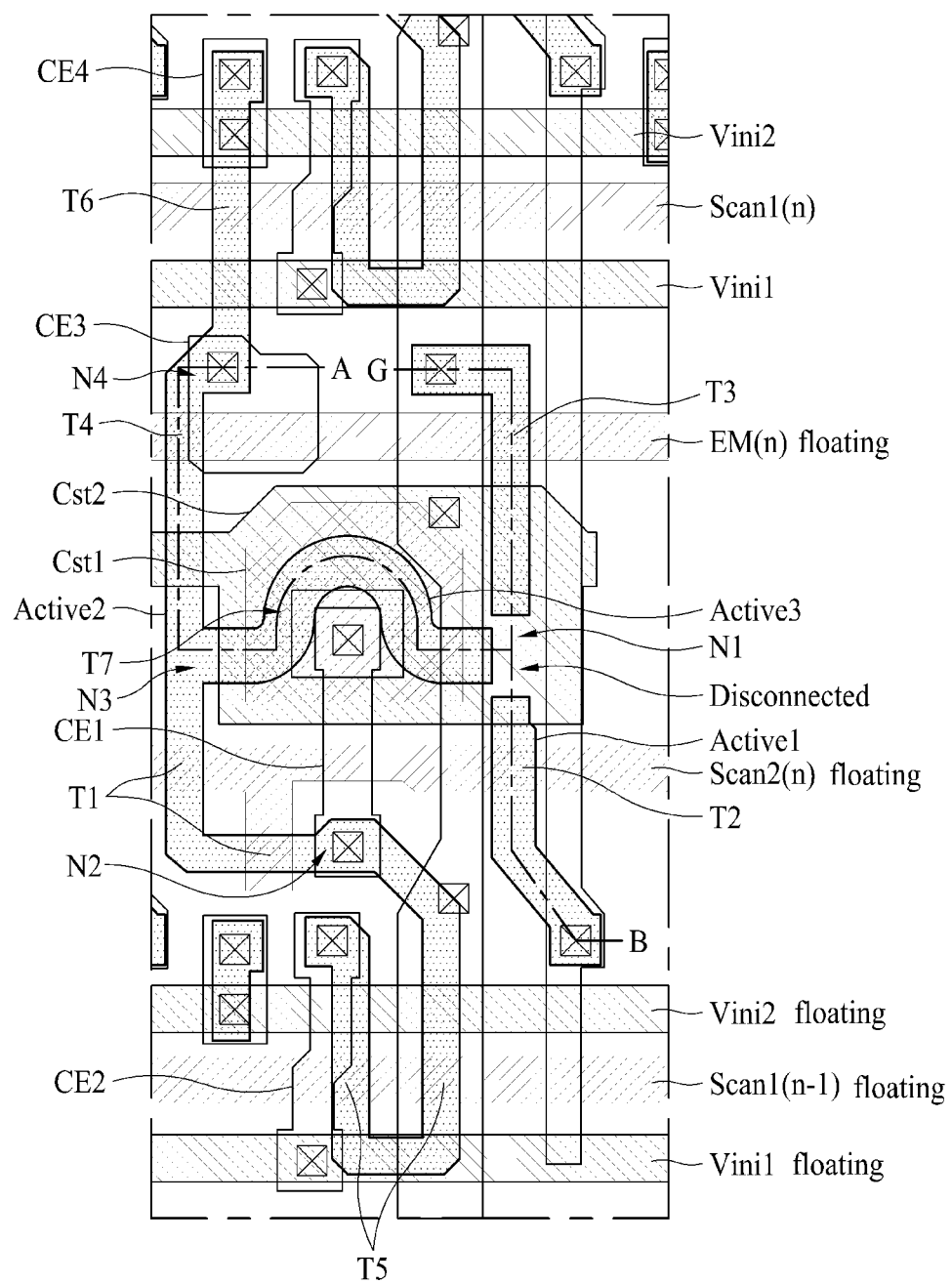
FIG. 9 is a plane view illustrating a dummy pixel in the dummy area of the electroluminescent display device according to another embodiment of the present disclosure.

FIG. 9 is a plane view illustrating a dummy pixel in the dummy area of the electroluminescent display device according to another embodiment of the present disclosure. The dummy pixel of FIG. 9 shows the detailed embodiment to which the unit circuit diagram with the disconnected first node N1 of FIG. 8 is applied. Except that an active layer Active1, Active3 of the first node N1 is disconnected, the dummy pixel of FIG. 9 is identical to the dummy pixel of FIG. 6. Thus, only different parts will be described in detail.

Referring to above FIG. 6, the first active layer Active1 is connected between the second thin film transistor T2 and the third thin film transistor T3, and the first active layer Active1 is also connected with the third active layer Active3.

Referring to FIG. 9, the first active layer Active1 is disconnected between the second thin film transistor T2 and the third thin film transistor T3. Additionally, the first active layer Active1 is disconnected from the third active layer Active3. Thus, referring to FIG. 9, it is possible to prevent an abnormal signal from flowing into the data line Vdata via the second thin film transistor T2.

Figure 10:
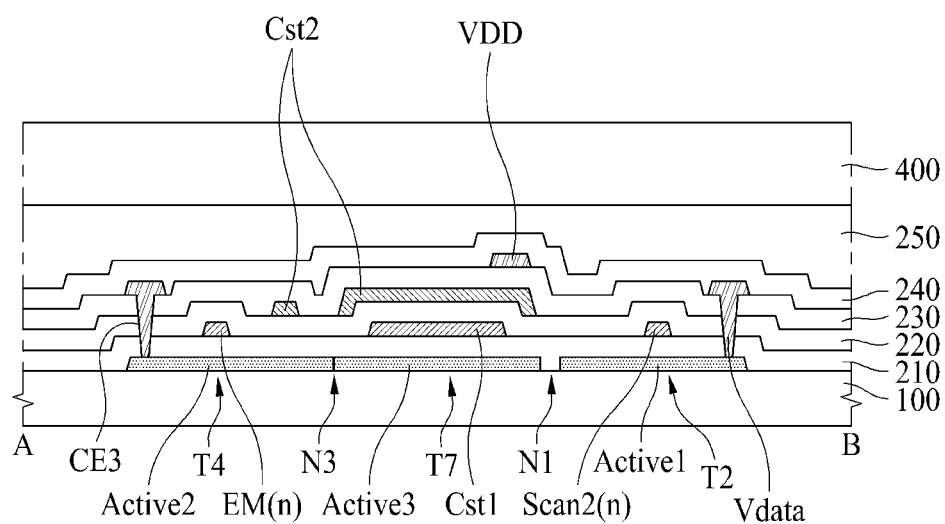
FIG. 10 is a cross sectional view along A-B line of FIG. 9.

FIG. 10 is a cross sectional view along A-B line of FIG. 9. Except that the first active layer Active1 and the third active layer Active3 are disconnected at the first node N1, a bank 400 is formed on a planarization layer 250, and an anode electrode, an emission layer and a cathode electrode are not formed on the planarization layer 250, the cross sectional view of FIG. 10 is identical to the cross sectional view of FIG. 4.

Figure 11:
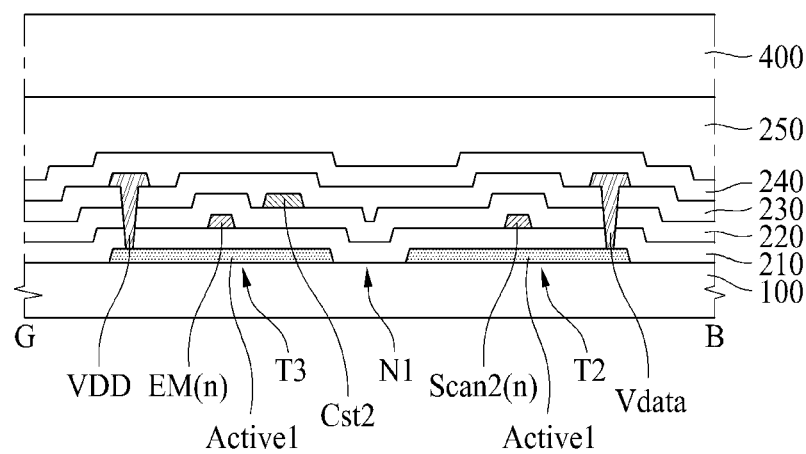
FIG. 11 is a cross sectional line along G-B line of FIG. 9.

FIG. 11 is a cross sectional view along G-B line of FIG. 9. As shown in FIG. 11, the first active layer Active1 is disconnected while being provided on a substrate 100. That is, two portions of the first active layer Active1 are spaced apart from each other while being provided with the first node N1 interposed in-between.

A gate insulating layer 210 is formed on the first active layer Active1, and an emission line EM(n) and a second scan line Scan2(n) are formed on the gate insulating layer 210. The emission line EM(n) functions as a gate electrode of the third thin film transistor T3, and the second scan line Scan2(n) functions as a gate electrode of the second thin film transistor T2.

A first insulating interlayer 220 is formed on the emission line EM(n) and the second scan line Scan2(n), and a second capacitor electrode Cst2 is formed on the first insulating interlayer 220.

A second insulating interlayer 230 is formed on the second capacitor electrode Cst2, and a high power source line VDD and a data line Vdata are formed on the second insulating interlayer 230.

The high power source line VDD is connected with the first active layer Active1 of the third thin film transistor T3 via a contact hole provided in the gate insulating layer 210, the first insulating interlayer 220 and the second insulating interlayer 230. The data line Vdata is connected with the first active layer Active1 of the second thin film transistor T2 via a contact hole provided in the gate insulating layer 210, the first insulating interlayer 220 and the second insulating interlayer 230.

Accordingly, one end of the first active layer Active1 of the second thin film transistor T2 is connected with the data line Vdata via a contact hole, one end of the first active layer Active1 of the third thin film transistor T3 is connected with the high power source line VDD via a contact hole, and the other end of the first active layer Active1 of the second thin film transistor T2 and the other end of the first active layer Active1 of the third thin film transistor T3 face each other with the gate insulating layer 210 is interposed in-between.

A passivation layer 240 is formed on the high power source line VDD and the data line Vdata, a planarization layer 250 is formed on the passivation layer 240, and a bank 400 is formed on the planarization layer 250.

As shown in FIG. 11, even though an abnormal signal is applied to the emission line EM(n), the first active layer Active1 of the third thin film transistor T3 is disconnected from the first active layer Active1 of the second thin film transistor T2, whereby it is possible to prevent the abnormal signal from flowing into the data line Vdata via the second thin film transistor T2.

According to one embodiment of the present disclosure, the switching thin film transistor and the operation control thin film transistor are disconnected from each other. Thus, even though the operation control thin film transistor is turned-on by the abnormal signal applied to the emission line, it is possible to prevent the abnormal signal from flowing into the data line via the switching thin film transistor, to thereby prevent an occurrence of a vertical linear mura.

The above-described feature, structure, and effect of the present disclosure are included in at least one embodiment of the present disclosure, but are not limited to only one embodiment. Furthermore, the feature, structure, and effect described in at least one embodiment of the present disclosure may be implemented through combination or modification of other embodiments by those skilled in the art.

Therefore, content associated with the combination and modification should be construed as being within the scope of the present disclosure.

It will be apparent to those skilled in the art that various modifications and variations can be made in the present disclosure without departing from the spirit or scope of the disclosures. Thus, it is intended that the present disclosure covers the modifications and variations of this disclosure provided they come within the scope of the appended claims and their equivalents.

What is claimed is:

1. An electroluminescent display device comprising:
an active area for displaying an image, the active area including a plurality of pixels, each of the pixels including a plurality of first thin film transistors and a light emitting device; and
a dummy area provided in a periphery of the active area, wherein an image is not displayed in the dummy area, the dummy area including a plurality of dummy pixels, each of the dummy pixels including a plurality of second thin film transistors but not including the light emitting device;
wherein each of the dummy pixels of the dummy area includes:
a scan line, an initializing line and an emission line arranged along a first direction in the dummy area; and
a high power source line and a data line arranged along a second direction, which intersects with the first direction, in the dummy area; and
wherein the plurality of second thin film transistors in each of the dummy pixels includes:
a driving thin film transistor,
a switching thin film transistor provided to be connected with the data line, and
an operation control thin film transistor provided to be connected with the high power source line,
wherein the driving thin film transistor, the switching thin film transistor and the operation control thin film transistor in each of the dummy pixels are disconnected from each other at a first node.

2. The electroluminescent display device according to claim 1,
wherein the switching thin film transistor includes a first active layer configured to form channel, source and drain areas of the switching thin film transistor,
wherein the operation control thin film transistor includes a first active layer configured to form channel, source and drain areas of the operation control thin film transistor, and
wherein the first active layer of the switching thin film transistor is disconnected from the first active layer of the operation control thin film transistor.

3. An electroluminescent display device comprising,
an active area for displaying an image, the active area including a plurality of pixels, each of the pixels including a plurality of first thin film transistors and a light emitting device; and
a dummy area provided in a periphery of the active area, wherein an image is not displayed in the dummy area, the dummy area including a plurality of dummy pixels, each of the dummy pixels including a plurality of second thin film transistors but not including the light emitting device;
wherein each of the dummy pixels of the dummy area includes:
a scan line, an initializing line and an emission line arranged along a first direction in the dummy area; and
a high power source line and a data line arranged along a second direction, which intersects with the first direction, in the dummy area; and
wherein the plurality of second thin film transistors in each of the dummy pixels includes:
a driving thin film transistor,
a switching thin film transistor provided to be connected with the data line, and
an operation control thin film transistor provided to be connected with the high power source line,
wherein the switching thin film transistor and the operation control thin film transistor in each of the dummy pixels are disconnected from each other,
wherein the switching thin film transistor includes a first active layer configured to form channel, source and drain areas of the switching thin film transistor,
wherein the operation control thin film transistor includes a first active layer configured to form channel, source and drain areas of the operation control thin film transistor, and
wherein the first active layer of the switching thin film transistor is disconnected from the first active layer of the operation control thin film transistor,
wherein the first active layer of the switching thin film transistor extends in the second direction, and a first end of the first active layer of the switching thin film transistor is connected with the data line via a first contact hole,
wherein the first active layer of the operation control thin film transistor extends in the second direction, and a first end of the first active layer of the operation control thin film transistor is connected with the high power source line via a second contact hole, and
wherein a second end of the first active layer of the switching thin film transistor and a second end of the first active layer of the operation control thin film transistor face each other with an insulating layer is interposed in-between.

4. The electroluminescent display device according to claim 1, wherein the scan line functions as a gate electrode of the switching thin film transistor, and the emission line functions as a gate electrode of the operation control thin film transistor.

5. The electroluminescent display device according to claim 1, wherein the emission line is in a floating state.

6. The electroluminescent display device according to claim 1, wherein the emission line is electrically connected with the initializing line.

7. The electroluminescent display device according to claim 1, wherein the switching thin film transistor is disconnected from the driving thin film transistor.

8. The electroluminescent display device according to claim 7, wherein:
the switching thin film transistor includes a first active layer configured to form channel, source and drain areas of the switching thin film transistor,
the driving thin film transistor includes a second active layer configured to form channel, source and drain areas of the driving thin film transistor, and
the first active layer of the switching thin film transistor is disconnected from the third active layer of the driving thin film transistor.

9. The electroluminescent display device according to claim 2, further comprising:
a second active layer extending parallel to the first active layer, and a third active layer provided between the first active layer and the second active layer, wherein the second active layer forms the channel, source and drain areas of a subset of the plurality of thin film transistors other than the switching thin film transistor, the operation control thin film transistor, and the driving thin film transistor, wherein the subset of the plurality of thin film transistors are connected with each other, wherein the third active layer forms the channel, source and drain areas of the driving thin film transistor, and wherein the second active layer and the third active layer are connected with each other.

10. The electroluminescent display device according to claim 9, wherein the second active layer forms channel, source and drain areas in each of a compensation thin film transistor, an initializing thin film transistor, an emission control thin film transistor and a bypass thin film transistor.

11. The electroluminescent display device according to claim 10, further comprising:
a first connection electrode configured to connect the second active layer and a gate electrode of the driving thin film transistor with each other;
a second connection electrode configured to connect the second active layer and a first initializing line for the initializing line;
a third connection electrode connected with the second active layer via a contact hole; and
a fourth connection electrode configured to connect the second active layer and a second initializing line for the initializing line,
wherein the first connection electrode, the second connection electrode, the third connection electrode, and the fourth connection electrode are provided in a same layer as the high power source line and the data line, and
wherein the first connection electrode, the second connection electrode, the third connection electrode, and the fourth connection electrode are formed of a same material as the high power source line and the data line.

12. The electroluminescent display device according to claim 1,
wherein the active area includes:
an additional scan line, an additional initializing line, and an additional emission line arranged in the first direction;
an additional high power source line and an additional data line arranged in the second direction; and
a plurality of additional thin film transistors including an additional driving thin film transistor, an additional switching thin film transistor, and an additional operation control thin film transistor,
wherein the additional operation control thin film transistor and the additional switching thin film transistor provided in the active area are connected with each other.

13. The electroluminescent display device according to claim 12,
wherein the additional switching thin film transistor includes an additional first active layer configured to form channel, source and drain areas of the additional switching thin film transistor,
wherein the additional operation control thin film transistor includes an additional first active layer configured to form channel, source and drain areas of the additional operation control thin film transistor, and wherein the additional first active layer of the additional switching thin film transistor is connected with the additional first active layer of the additional operation control thin film transistor.

14. The electroluminescent display device according to claim 13,
wherein the active area includes an additional second active layer extending parallel to the additional first active layer, and an additional third active layer provided between the additional first active layer and the additional second active layer,
wherein the additional second active layer forms channel, source and drain areas of a subset of the plurality of additional thin film transistors other than the additional switching thin film transistor, the additional operation control thin film transistor, and the additional driving thin film transistor, wherein the subset of the plurality of additional thin film transistors are connected with each other,
wherein the additional third active layer forms channel, source and drain areas of the additional driving thin film transistor, and
wherein the additional first active layer, the additional second active layer and the additional third active layer are connected with one another.

15. The electroluminescent display device according to claim 1, wherein the operation control thin film transistor is disconnected from the driving thin film transistor.

16. An electroluminescent display device comprising:
an active area for displaying an image, the active area including a plurality of pixels, each of the pixels including a plurality of thin film transistors and a light emitting device; and
a dummy area provided in a periphery of the active area, wherein an image is not displayed in the dummy area, the dummy area including a plurality of dummy pixels, each of the dummy pixels including a plurality of dummy thin film transistors but not including the light emitting device;
an active layer configured to form channel, source and drain areas of the plurality of thin film transistors provided in the active area; and
a dummy active layer provided in the dummy area and configured to form channel, source and drain areas of the plurality of dummy thin film transistors,
wherein a pattern of the active layer is different from a pattern of the dummy active layer,
wherein the dummy active layer includes a dummy first active layer configured to form channel, source and drain areas of a first and second dummy thin film transistors of the plurality of dummy thin film transistors, a dummy second active layer extending parallel to the dummy first active layer, and a dummy third active layer provided between the dummy first active layer and the dummy second active layer,
wherein the dummy first active layer is disconnected between the first and second dummy thin film transistors, and the dummy third active layer is connected with the dummy second active layer without being connected with the dummy first active layer.

17. The electroluminescent display device according to claim 16,
wherein the active layer includes a first active layer configured to form channel, source and drain areas of a first and second thin film transistors of the plurality of thin film transistors, and wherein the first active layer is connected between the first and second thin film transistors.

18. The electroluminescent display device according to claim 17,
wherein the active layer includes a second active layer extending parallel to the first active layer, and a third active layer provided between the first active layer and the second active layer and connected with each of the first active layer and the second active layer.

19. The electroluminescent display device according to claim 17,
wherein the dummy area includes a dummy high power source line and a dummy data line arranged in a predetermined direction,
wherein the first dummy thin film transistor is a dummy switching thin film transistor connected with the dummy data line, and
wherein the second dummy thin film transistor is a dummy operation control thin film transistor connected with the dummy high power source line.

20. The electroluminescent display device according to claim 16,
wherein the active area includes an organic light emitting device including an anode electrode, an emission layer, and a cathode electrode,
wherein the dummy area additionally includes a dummy first scan line and a dummy second scan line, a dummy first initializing line and a dummy second initializing line, and a dummy emission line, which are arranged in a first direction,
wherein the dummy area additionally includes a dummy high power source line and a dummy data line arranged in a second direction which intersects with the first direction, and
wherein the dummy second scan line, the dummy emission line and the dummy second initializing line are in a floating state.

21. The electroluminescent display device according to claim 16, wherein the plurality of dummy thin film transistors includes a dummy switching thin film transistor and a dummy operation control thin film transistor, and wherein the dummy switching thin film transistor is disconnected from the dummy operation control thin film transistor.

22. The electroluminescent display device according to claim 21, wherein the plurality of dummy thin film transistors further includes a dummy driving thin film transistor, and wherein the dummy switching thin film transistor is disconnected from the dummy driving thin film transistor.

23. The electroluminescent display device according to claim 21, wherein the plurality of dummy thin film transistors further includes a dummy driving thin film transistor, and wherein the dummy operation control thin film transistor is disconnected from the dummy driving thin film transistor.

* * * * *